(12) United States Patent
Freeman et al.

(10) Patent No.: US 7,361,593 B2
(45) Date of Patent: Apr. 22, 2008

(54) METHODS OF FORMING VIAS IN MULTILAYER SUBSTRATES

(75) Inventors: William R. Freeman, Castro Valley, CA (US); Hong Jin Jiang, Singapore (SG)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/027,745

(22) Filed: Dec. 30, 2004

(65) Prior Publication Data
US 2005/0285172 A1   Dec. 29, 2005

Related U.S. Application Data

(63) Continuation-in-part of application No. 10/740,241, filed on Dec. 17, 2003, now Pat. No. 7,259,466.

(60) Provisional application No. 60/533,979, filed on Dec. 31, 2003, provisional application No. 60/435,316, filed on Dec. 17, 2002.

(51) Int. Cl.
*H01L 21/44* (2006.01)
(52) U.S. Cl. ....................... 438/675; 438/667
(58) Field of Classification Search ................ 438/660, 438/661, 662, 663, 672, 675, 613, 615, 667
See application file for complete search history.

(56) References Cited

U.S. PATENT DOCUMENTS

| | | | |
|---|---|---|---|
| 4,883,215 A | | 11/1989 | Goesele et al. |
| 5,318,652 A | | 6/1994 | Horning et al. |
| 5,346,848 A | | 9/1994 | Grupen-Shemansky et al. |
| 5,347,162 A | * | 9/1994 | Pasch ......................... 257/773 |
| 5,407,856 A | | 4/1995 | Quenzer et al. |
| 5,413,955 A | | 5/1995 | Lee et al. |
| 5,695,590 A | | 12/1997 | Wilcox et al. |
| 5,718,367 A | * | 2/1998 | Covell et al. ............... 228/254 |
| 5,728,624 A | | 3/1998 | Linn et al. |

(Continued)

FOREIGN PATENT DOCUMENTS

EP   0 441 270 B1   8/1991

(Continued)

OTHER PUBLICATIONS

David G. Morrison, *Interconnects, Packaging, Interconnects Move to the Fore*, Electronic Design, Jan. 7, 2002, pp. 89-93.

(Continued)

*Primary Examiner*—S. V. Clark
(74) *Attorney, Agent, or Firm*—Workman Nydegger

(57) ABSTRACT

Exemplary embodiments of the present invention illustrate methods to electrically connect multiple layers of a substrate. A first and second layer each has at least one electrical trace on a surface thereof. The substrate includes an interposer structure attached to the second layer and separating the first and second layers on at least a portion of a perimeter of the first and second layers. The method includes a steps for forming a via in the first layer, placing a first electrically conductive substance in the via, placing a second electrically conductive substance on the second layer adjacent said via, and heating an area around said via and said second electrically conductive substance until said first and second electrically conductive substances at least partially melt to form the electrical connection.

24 Claims, 8 Drawing Sheets

U.S. PATENT DOCUMENTS

| | | |
|---|---|---|
| 5,820,648 A | 10/1998 | Akaike et al. |
| 5,843,832 A | 12/1998 | Farmer et al. |
| 5,866,469 A | 2/1999 | Hays |
| 6,008,113 A | 12/1999 | Ismail et al. |
| 6,159,824 A | 12/2000 | Henley et al. |
| 6,168,678 B1 | 1/2001 | Plankenhorn et al. |
| 6,180,496 B1 | 1/2001 | Farrens et al. |
| 6,844,957 B2 * | 1/2005 | Matsumoto et al. ........ 359/296 |
| 2004/0214452 A1 | 10/2004 | Freeman |
| 2004/0262031 A1 * | 12/2004 | Gill et al. .................... 174/252 |
| 2005/0056937 A1 * | 3/2005 | Frank et al. ................. 257/758 |
| 2006/0220230 A1 * | 10/2006 | Tanaka et al. ............... 257/723 |

FOREIGN PATENT DOCUMENTS

| | | |
|---|---|---|
| EP | 0 664 557 A2 | 7/1995 |
| JP | 61-145839 | 7/1986 |
| JP | 62-265728 | 11/1987 |
| JP | 63-111652 | 5/1988 |
| JP | 09/97755 | 4/1997 |
| JP | 11-219872 | 8/1999 |
| JP | 2000-121468 | 4/2000 |
| KR | 1990-0003249 | 5/1990 |
| WO | WO 01/29890 A2 | 4/2001 |

OTHER PUBLICATIONS

John Baliga, *High-Density Packaging: The Next Interconnect Challenge,* Alpine Microsystems, Feb. 2000.

* cited by examiner

METHODS OF FORMING VIAS IN MULTILAYER SUBSTRATES

CROSS-REFERENCE TO RELATED APPLICATIONS

This application is a continuation-in-part application of U.S. patent application Ser. No. 10/740,241, filed on Dec. 17, 2003 now U.S. Pat. No 7,259,466, and entitled "Low Temperature Bonding of Multilayer Substrates" which claims priority to and the benefit of U.S. Provisional Patent Application Ser. No. 60/435,316, filed Dec. 17, 2002, and entitled "Low Temperature Bonding of Multilayer Glass", both of which are incorporated herein by reference in their entireties. This application also claims priority to and the benefit of U.S. Provisional Patent Application Ser. No. 60/533,979, entitled "Advanced Substrates for Integrated Devices", filed on Dec. 31, 2003, which is also incorporated herein by reference in its entirety. Furthermore, this application is related to U.S. patent application Ser. No. 10/846,210, filed on May 14, 2004 and entitled "Method for Optically Trimming Electronic Components" which is a continuation-in-part application of U.S. patent application Ser. No. 10/689,456, filed Oct. 20, 2003, and entitled "Optically Trimming Electronic Components," which application claims the benefit of U.S. Provisional Application Ser. No. 60/419,356, filed Oct. 18, 2002, all of which are incorporated herein by reference in their entireties. It is understood that, in the event of a discrepancy between this application and the applications incorporated by reference above, the information contained in this application shall take precedence.

BACKGROUND OF THE INVENTION

1. The Field of the Invention

This invention relates generally to the field of bonding stacked silicon and glass wafers. In particular, exemplary embodiments of the present invention relate to improved devices and methods of anodically bonding multiple wafers or layers, and, more specifically, to methods of forming vias between the layers.

2. The Relevant Technology

Anodic bonding, also known as field assisted glass-silicon sealing, is a process which permits the sealing of silicon to glass at a temperature below the melting point of glass. The silicon and glass pieces, wafers, layers, or substrates are heated by an electrical device to about 400-500 degrees Celsius (° C.). FIG. 1 illustrates one general system that can be used to anodically bond silicon and glass pieces, wafers, layers, or substrates. The electrical device, such as a voltage source 105, applies a voltage across the wafers on the order of mid to high 100s of volts to heat up the wafers to the required temperature. Generally, a positive terminal 106 of the electrical device is connected to an anode, such as an aluminum plate 125, located on or below a silicon wafer 120. Likewise, negative terminal 108 of the electrical device is connected to a cathode 110 located on or above a glass wafer 115. After applying voltage across the wafers one time, the silicon and glass are bonded together and can be cooled to room temperature.

This type of bonding is thought to be the result of mobile ions in the glass wafer. At higher temperatures, the negative ions on cathode 110 attract the positive sodium ions (Na+), causing the sodium ions to travel towards the cathode end of glass wafer 115. The remaining negative ions in glass wafer 115 form a space charge on the side of glass wafer 115 adjacent to silicon wafer 120. This generates an electric field, which pulls silicon wafer 120 and glass wafer 115 together during the process. Therefore, while the voltage is applied across the wafers and the temperature is raised, an electric field pulls the wafers together. After removing the voltage, the wafers are irreversibly chemically bonded together. The force of the electric field that pulls the wafers together is given by the equation F=E/d, where E is the electric field and d is the distance or gap between the wafers. Therefore, the smaller the gap between the wafers, the greater the force generated by the electric field. This provides incentive to make the surfaces as smooth and parallel as possible, in order to achieve the maximum force for a given electric field strength.

One way to think about anodic bonding is that the silicon-oxygen (Si—O) surface bonds must be broken and reformed through contact with the other wafer. This is a relatively strong bond (approximately 560 kcal/mole), which means that a large amount of energy is required to break these bonds. This energy can come from an elevated temperature and/or application of an electric field to the multilayer or wafer structure. The best way to increase the energy of the electric field is to decrease the separation between the wafers, i.e. decrease the distance in the force equation, through having low surface roughness $R_a$ and very good planarity. In one embodiment, the surface roughness can be less than about 2 nm average roughness. There are many descriptions or definitions of surface roughness that can be used. One common description or definition that corresponds closely to what one would intuitively think by feeling a surface with the hand can be defined as $R_a=(1/L)\int_0^L |z(x)-z_{ave}|dx$, where $z(x)$ represents the surface height at a given point, and $z_{ave}$ is the average surface height. Thus, $R_a$ is the integrated absolute deviation from the mean surface height within a region (0, L). Our sense of roughness, therefore, is closely modeled by absolute mean deviations rather than mean squared deviations for instance.

In addition to the problems with obtaining low surface roughness, a problem with existing processes is the necessity to use a high voltage and high temperatures to bond the wafers. Temperature and voltage can be generally independently controlled. The relationship between temperatures and voltage lies in the drifting of the ions being faster at higher temperatures and also faster at higher voltages. The temperature and voltage required for this process can cause extensive damage to pre-fabricated printed circuit boards (PCBs). Therefore, using prior art processes, it is not possible to create an anodic bond between a glass wafer and a fully-functional silicon PCB that includes sensitive electrical components without causing significant damage to the electrical interconnects and components residing on the PCB.

In an effort to minimize space in an electrical circuit, it is often advantageous to stack boards on top of one another with interposer wafers between them. If the current anodic bonding process is used, only a single silicon wafer can be bonded with a glass wafer because the electrical components and interconnects must be added after the anodic bonding process is complete. In contrast, if one could develop an improved low-temperature, low-voltage anodic bonding process, multiple fully-functional PCBs could be bonded with multiple glass wafers.

There are other techniques for fabricating multilayer or multi-wafer substrates. Unfortunately, these other fabrication processes require even higher temperatures than required to anodically bonding silicon and glass wafers. For example, low temperature co-fired ceramic (LTCC) processes, which are common in the semiconductor and telecommunication industries, require temperatures in the range of about 850° C.

BRIEF SUMMARY OF THE EMBODIMENTS

Exemplary embodiments of the present invention illustrate methods to electrically connect multiple layers of a substrate. A first and second layer each has at least one electrical trace on a surface thereof. The substrate includes an interposer structure attached to the second layer and separating the first and second layers on at least a portion of a perimeter of the first and second layers. The method includes a step for forming a via in the first layer and placing a first electrically conductive substance in the via. A second electrically conductive substance is placed on the second layer adjacent to the via. Finally, an area around the via and the second electrically conductive substance is heated until the first and second electrically conductive substances at least partially melt to form the electrical connection.

In some embodiments, the heating process is accomplished as part of an anodic bonding process that bonds the two layers together. In this embodiment, an amorphous thin film can be applied to one of a first contact side of the first layer and a second contact side of the interposer structure. Then a voltage can be applied to the layers to anodically bond them together at a temperature below 300 degrees Celsius. The anodic bond heating also provides sufficient heat to join the layers. In one embodiment, the voltage is approximately 700 volts. In alternate embodiments, the heating step is provided using a laser directed at the electrically conductive substances.

In still other embodiments, the heating step melts the second electrically conductive substance such that a surface tension of the melted substance allows it to bead up and contact the first substance. In another alternate embodiment, the first and second electrically conductive substances are in contact with each other prior to the heating step.

In yet other embodiments, the first electrically conductive substance can be a pin fixed within the via. The second electrically conductive substance is then a preformed washer having a hole, where the hole receives the pin and the washer melts to form the electrical connection during the heating step.

These and other objects and features of the present invention will become more fully apparent from the following description and appended claims, or can be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE EMBODIMENTS

Reference will now be made to the drawings to describe illustrative embodiments of the present invention. It is to be understood that the drawings are diagrammatic and schematic representations of the illustrative embodiments, and are not limiting of the present invention, nor are they necessarily drawn to scale.

In general, the present invention relates to an improved anodic bonding process that operates at a lower temperature and voltage than traditional anodic bonding processes. Exemplary embodiments of the bonding processes of the invention can be used to bond multiple wafers, layers, or substrates that can be used in optical and photonics applications and other environments. As described below, the bonding temperature is low enough to permit the bonding processes to be compatible with soldered components, since these low temperatures are within the range of standard reflow processes. Moreover, the bonding processes are performed at a temperature that is low enough to permit passive and active components to be embedded in the bonded wafers or layers and to permit the use of thermally resistant polymer materials in the structures. Additionally, embodiments of the present invention provide several methods for forming the vias (electrical connections or pathways) between the various layers of the multi-layer substrates.

Although the invention is described herein primarily in the context of bonding glass wafers, the principles of the invention also extend to the bonding of other types of materials, including a variety of inorganic or hybrid organic-inorganic materials, whether or not such materials form wafers or layers. Examples include, but are not limited to, ceramics, sol-gels, silicon, sapphire, and other crystalline or polycrystalline materials.

Figure 1:
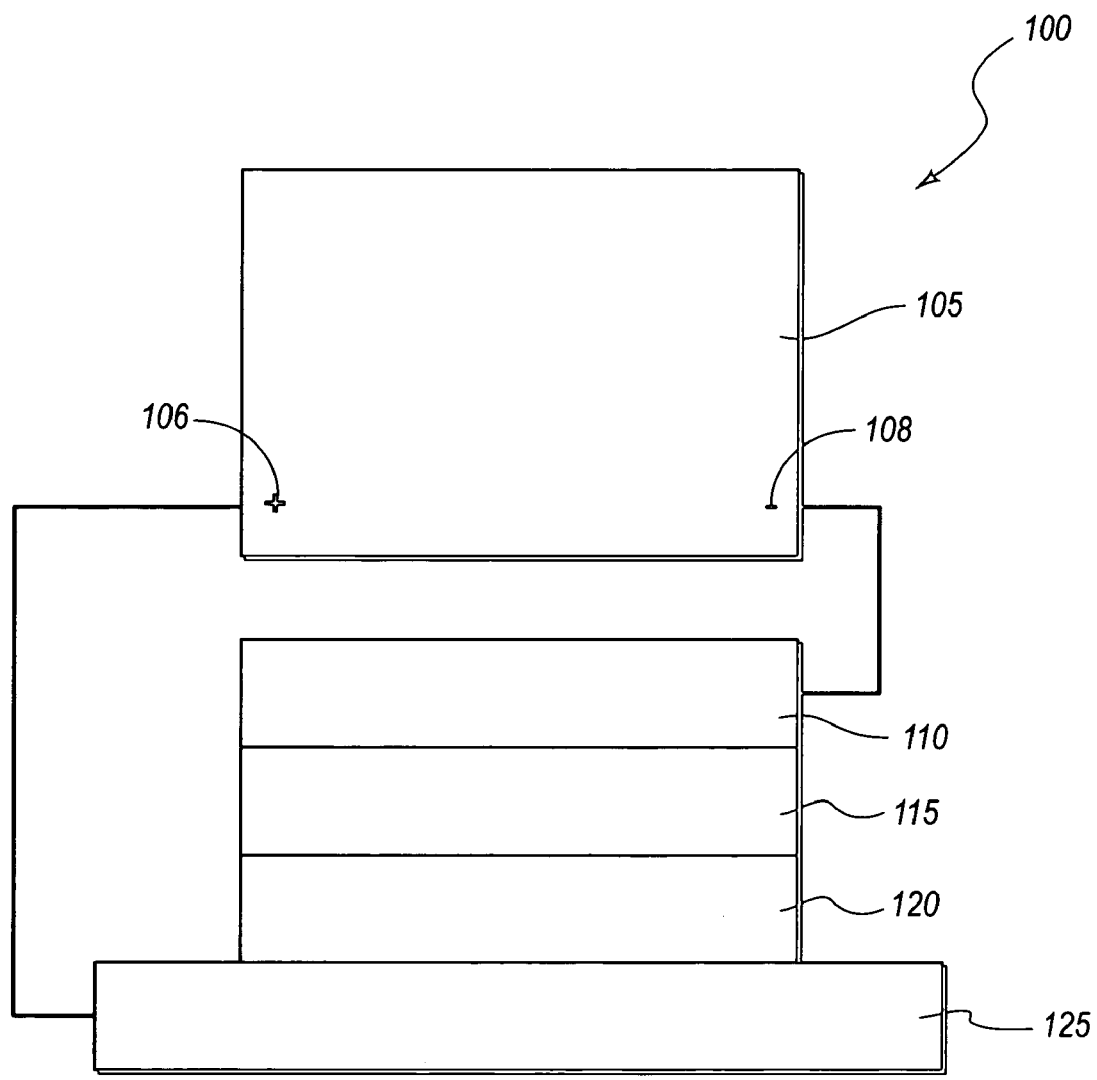
FIG. 1 illustrates a conventional system for performing a conventional anodic bonding process between a glass wafer and a silicon wafer.
Figure 2A:
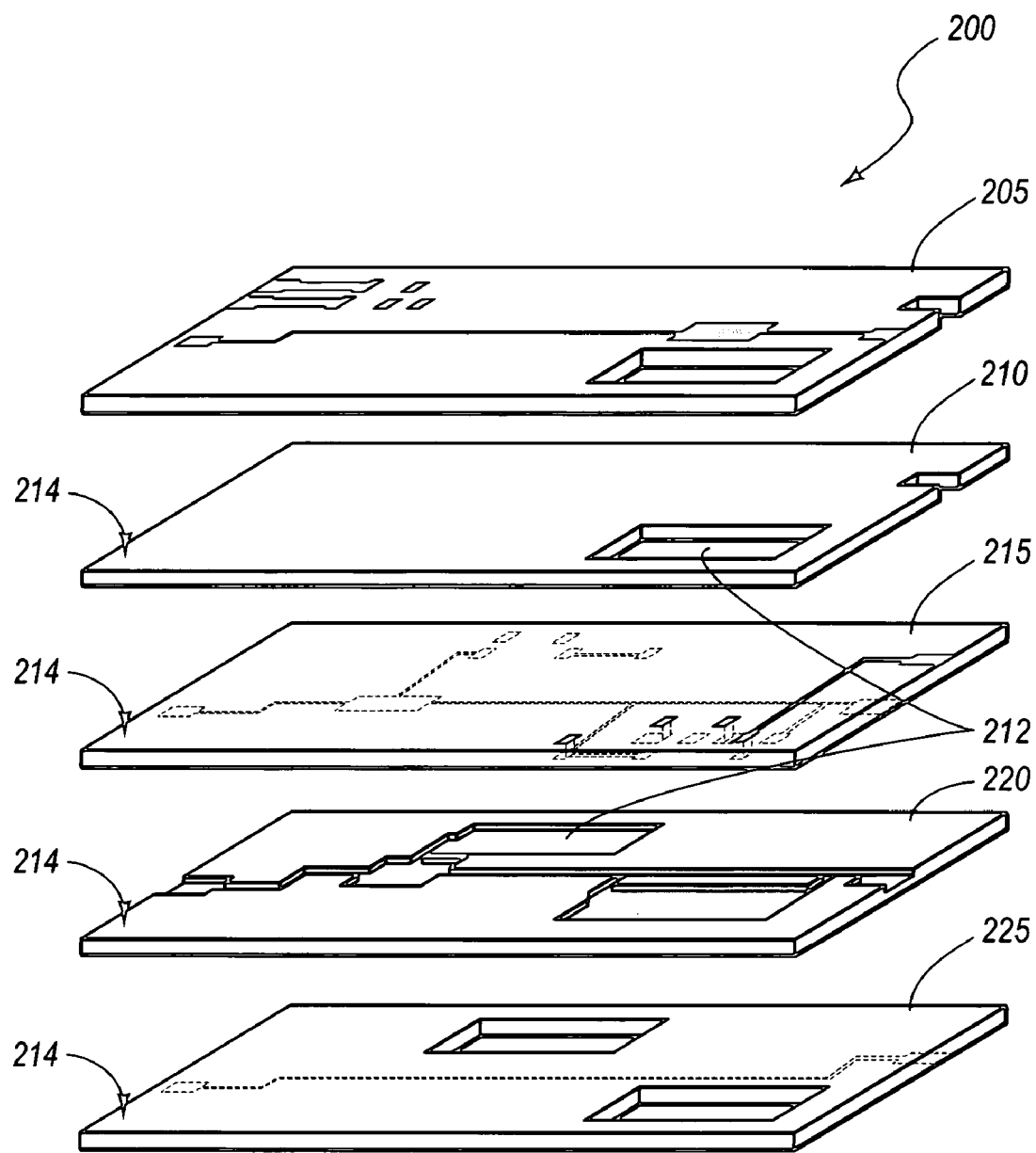
FIG. 2A illustrates an exploded view of a stacked semiconductor device in accordance with one aspect of the present invention.

Reference is made to FIG. 2A, which illustrates an exploded view of an illustrative stacked semiconductor device, designated generally as reference numeral 200. Wafers 205, 215 and 225 are circuit wafers, while wafers 210 and 220 are spacer or interposer wafers that separate the adjacent circuit wafers 215 and 225. An amorphous thin film 214 is deposited on at least one of the contacting surfaces of wafers 205, 210, 215, 220 and 225 to facilitate the low temperature process. The silicon layer blocks the migration of ions, mostly $Na^+$ ions, which are responsible for the build up of the electric field along the bond line. The improved anodic bonding process is used to bond the illustrated semiconductor and glass wafers 205, 210, 215, 220, 225 together without interfering with the existing circuitry on the individual wafers.

As shown in FIG. 2A, indentations or cutouts 212 on interposer wafers 210 and 220 provide clearance so that the patterned portions of circuit wafers 205, 215, 225 do not interfere with the contact between interposer wafers 210 and 220 and circuit wafers 205, 215, 225. This is shown in more detail in FIG. 2B, which will be discussed below. Although interposer wafers 210 and 220 are generally a patterned piece of glass, other materials are not precluded. For instance, interposer wafers 210 and 220 can be fabricated from spin-on inorganic or hybrid organic/inorganic material, such as sol-gels, silicon, sapphire, and other crystalline or polycrystalline materials. Also, the number of wafers, layers, or substrates is arbitrary. Exemplary embodiments of the devices and methods of the present invention allow the use of greater than 2 wafers, layers, or substrates.

The interposer wafers 210 and 220 can be formed in a number of ways. One particularly convenient way is to use one or more of circuit wafers 205, 215, and 225 as a mold before forming the holes in circuit wafer 205, 215, 225 for mounting the integrated circuits or the like. For example, a sol-gel mold can be made of the surface profile of one or more of circuit wafers 205, 215, 225. This sol-gel mold can be subsequently photo-polymerized, etched to ensure adequate clearance, and finally densified into a glass-like plate. This plate can then be polished and surface activated for bonding to the circuit wafers 205, 215, 225.

Alternately, interposer wafers 210 and 220 can be formed by laser diffusion of the traces and some of the passive components directly into the glass substrate. This eliminates the problem of features being above the surface. Yet another method of alleviating surface relief issues is to recognize that in most cases, the goal of the bonding of the wafers is to form a hermetic or nearly hermetic package. This can be accomplished by bonding the edges of the region containing a circuit, as will be discussed in more detail below with reference to FIG. 3A-3E.

Returning to FIG. 2A, the bonding process associated with bonding multiple wafers, layers, or substrates is facilitated by preparation of the surfaces of the wafers that are to be bonded. This preparation process can include achieving a surface that is sufficiently smooth to enable direct contact between adjacent wafers. The process of smoothing the surface is sometimes known as Chemical Mechanical Planarization (CMP). The preparation process can further include activating the surface of one or more of wafers 205, 210, 215, 220, 225 using chemical or electrical activation techniques, and obtaining an interposer design that provides adequate contact between wafers 205, 210, 215, 220, 225 while providing clearance for circuit features of circuit wafers 205, 215, 225. These activation techniques can include aggressive chemical cleaning of portions of wafers 205, 210, 215, 220, 225 and/or $H_2$ plasma activation. The plasma activation is generally an attempt to increase the populations of hydrogenated and hydroxylated species on the surface of one or more of wafers 205, 210, 215, 220, 225. For example, in the case of silicon barrier wafers it is desired to increase the surface concentration of Si—OH and Si—H.

With continued reference to FIG. 2A, first wafer 205 can be formed from a rigid material, such as a semiconductor, a ceramic, a glass, or some combination thereof. Applied to first wafer 205 is amorphous thin film 214 that creates a high surface energy on, for example, a surface of first wafer 205. The amorphous thin film 214 can be, by way of example and not limitation, silicon, silicon suboxide, or any other film with the desired barrier properties that is compatible with the wafer substrate.

The high surface energy of first wafer 205 allows the materials in first wafer 205 and second wafer 210 to form more bonds with one another during the anodic bonding process. This increases the bond strength between the two wafers 205 and 210. It will be understood that the thin film 214 can be applied to second wafer 210 rather than first wafer 205. Consequently, the high surface energy of second wafer 210 allows the materials in first wafer 205 and second wafer 210 to form more bonds with one another during the anodic bonding process.

As a specific example of a process that can be used to achieve the bonding between first wafer 205 and second wafer 210, the surface coated with the thin film coating 214 are activated in a hydrogen plasma to form silicon-hydrogen (Si—H), and silicon-oxygen-hydrogen (Si—O—H) coated surfaces. Bringing these surfaces together under vacuum, heat, and some mechanical pressure in an electric field, forms Si—O—Si, Si—Si, and Si—O—O—Si bonds. This process can be used to bond multiple wafers at once, which is a marked improvement in the art.

The amorphous thin film 214 has certain barrier properties. The properties for the deposited barrier layer can include: 1) that it be able to effectively block the mobile ions in the substrate, wafer or layer; 2) that it match the coefficient of linear thermal expansion (CTE) of the substrate, wafer or layer well enough so that film stress is not a problem; and 3) that it have sufficient dielectric strength to survive, not punch through, the applied electric field. The thinner the film can be, the better for bonding. Additional criteria for the film can be application dependant. For example, when passing light in the visible region is important, then silicon suboxides may be used to provide the desired attenuation levels.

As mentioned previously, the force that draws the wafers, layers, or substrates together and that is at least partially responsible for breaking the bonds comes from the electric field created by blocking the ion migration. Since it is the deposited thin film 214 that blocks the ions, the maximum electric field strength is determined by the thickness of film 214. This thickness can range from about 20 nm to about 50 nm, although thicknesses greater and lesser than this range are possible. The actual force will be less because there will be some space between the deposited barrier layer and the next substrate, wafer, or layer. In the bonding process, the wafer, layer, or substrate is held and the mechanical pressure applied such that the center bonds first. Thus, the bonding ideally starts in the center of the wafer, layer, or substrate and proceeds to the edge. This way there are no "bubbles" in the resultant bonded wafer, layer, or substrate stack. It was mentioned that the spacing between the wafers can be done by depositing thicker bond layers. Specifically, this would increase the voltage necessary to achieve a given field strength if the deposited layer were merely a thick layer of silicon. The deposited layer should support the diffusion of ions through the bulk of it with as thin as practical diffusion stopping cap layer, silicon for instance. Notice that this precludes depositing metals which conduct electrons but not ions.

In most cases, it is sufficient to bond along the saw streets (discussed with reference to FIG. 2D) such that, after dicing, there is sufficient bonded area to insure hermeticity and mechanical strength. The mechanical strength can be between 2 GPa and 10 GPa, although other mechanical strengths higher or lower than this range are possible. This implies that one square millimeter can support a suspended weight of at least 200 kg. As an example, a 100 μm bond line, after dicing around a 1 mm square chip, can support at least 80 kg. Forming these waffle-like bonded areas can be the most practical, high volume application of this technique. Because the bond line is relatively thin, a few hundred microns generally, the bubble problem is nearly nonexistent. Also, the field is concentrated along these bond lines and away from the circuitry, eliminating concern about electrostatic discharge damage to the circuit components.

Figure 2B:
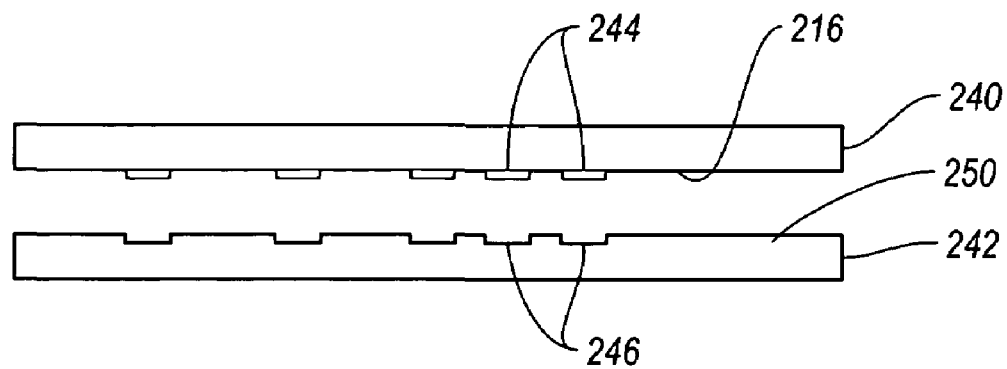
FIG. 2B illustrates one method for bonding layers in a substrate according to an alternate aspect of the present invention.

As discussed above, indentations or cutouts on the interposer wafers can provide clearance so that the patterned portions of the circuit wafers do not interfere with the contact between the interposer wafers and the circuit wafers. In FIG. 2A, a portion of the interposer wafer 210 is completely removed to create cutouts 212 and provide the desired clearance. FIG. 2B illustrates an alternate method of providing clearance between the patterned portions and the interposer layers. As shown in FIG. 2B, a circuit layer 240 is disposed opposite an interposer layer 242. A series of electrical traces or other printed electrical components 244 are disposed on a surface 246 of circuit layer 240. A series of complementary indentations or excavations 248 are disposed in a surface 250 of interposer layer 242. These indentations or excavations 248 extend part way through interposer layer 242, instead of completely through interposer wafer 210 as cutouts 212. This allows for even contact between surfaces 246 and 250, which can then be anodically bonded together, as described below with reference to FIGS. 3A-3E. The material and structures of circuit layer 240 and interposer layer 242 can be the same as that discussed above with respect to layers 205, 210, 215, 220, and 225. To be clear, trace 213 on the bottom side of wafer 215 is an above surface high current trace, while the trace on top of wafer 215 is a laser diffused trace within the substrate and thus below the surface eliminating the need for a cutout.

Figure 2C:
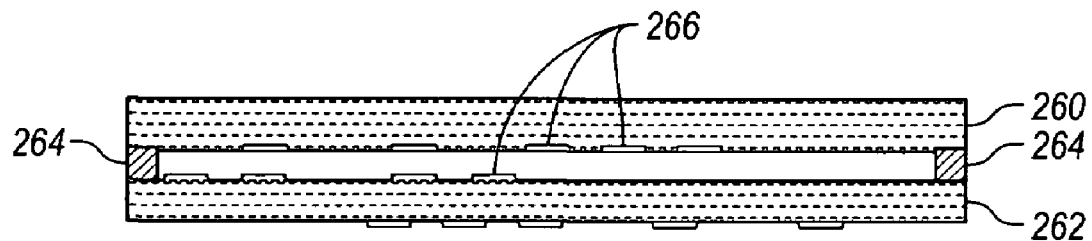
FIG. 2C illustrates an alternate method of bonding layers in a substrate.

An alternate method of joining two circuit layers is illustrated in FIG. 2C. As shown, a first circuit layer 260 is separated from a second circuit layer 262 by an interposer layer 264 that contacts a peripheral surface or edge of adjacent circuit layers 260 and 262. This allows the remaining surfaces of both circuit layers 260, 262 to include electrical traces or components 266, thus providing the advantage of having additional circuitry using the limited amount of space available.

The interposer layers described in FIGS. 2A-2C can be formed in a number of ways. As shown in FIG. 2A, the interposer layers can be a separate layer with holes etched through for the electrical traces. Alternately, the interposer layer can be formed only on the outside edges of the substrate, as shown in FIG. 2C. These interposer structures can be formed by Physical Vapor Deposition (PVD), Chemical Vapor Deposition (CVD), or any other form of deposition of material. As mentioned previously, the drawings are not to scale, and the actual thickness of interposer layer 264 can be much less or much greater than the thickness of circuit layers 260 and 262.

Figure 2D:
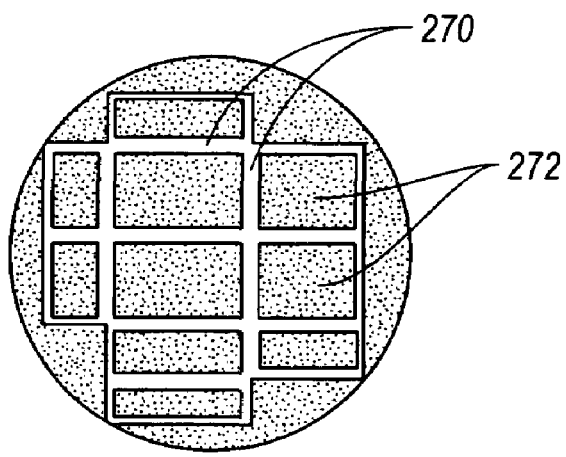
FIG. 2D illustrates one method of forming an interposer layer according to an alternate aspect of the present invention.

Another alternate method for forming an interposer layer is illustrated in FIG. 2D. In this embodiment, wells 272 that can be circuited can be etched into a substrate thereby forming a waffle pattern. Those raised portions of the substrate form a plurality of interposer structures 270, that collective act as an interposer layer. The Low Temperature Wafer Bonding (LTWB) process can then be performed on interposer structure 270 that forms saw streets. The pattern can be any shape, although for obvious reasons it is easier to dice the rectangular pattern. This allows entire circuit areas to be bonded together along only their outside edges. This process will be explained in much greater detail below with reference to FIGS. 3A-3E.

One example of an embodiment of a bonding process according to one aspect of the present invention is illustrated in FIGS. 3A-3E, and designated generally as reference numeral 300. In this configuration, a hermetically sealed package is formed by bonding one wafer to another wafer along the edges of the wafers, and optionally at discrete locations on the surfaces of the wafers, rather than over the entire surface of the wafers.

Figure 3A:
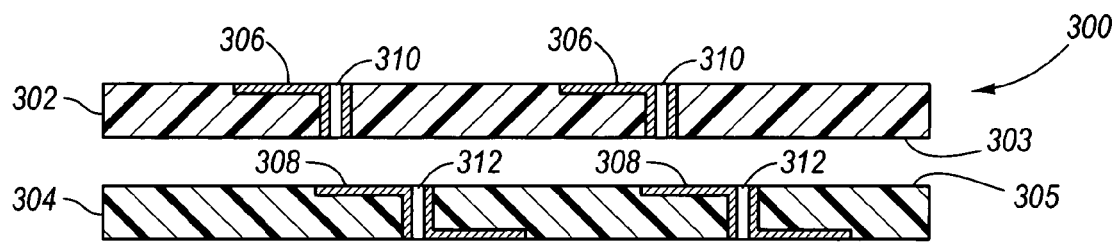
FIGS. 3A-3E illustrate the steps in one exemplary process of anodic bonding according to an alternate aspect of the present invention.

In the illustrated example, and with reference to FIG. 3A, a first wafer 302 having a first bond surface 303 is to be bonded to a second wafer 304 having a second bond surface 305 using a waffle technique. FIG. 3A represents a circuit fabrication process, in which the various electrical components/circuits are formed on wafers 302, 304. This circuit fabrication process was discussed in detail above with respect to FIG. 2.

First wafer 302 is a circuit wafer that can include one or more electrical components 306 and one or more through holes or vias 310. Second wafer 304 can be an interposer wafer that can also include one or more electrical components 308 and one or more through holes 312. Components 306, 308 can be any type of electrical component normally found on a printed circuit board, such as, but not limited to, resistors, capacitors, microchips, electrical pathways, etc. Through holes 310 can facilitate the electrical connection of the various circuits on wafer 302 with one or more electrical components 308 on wafer 304.

Figure 3B:
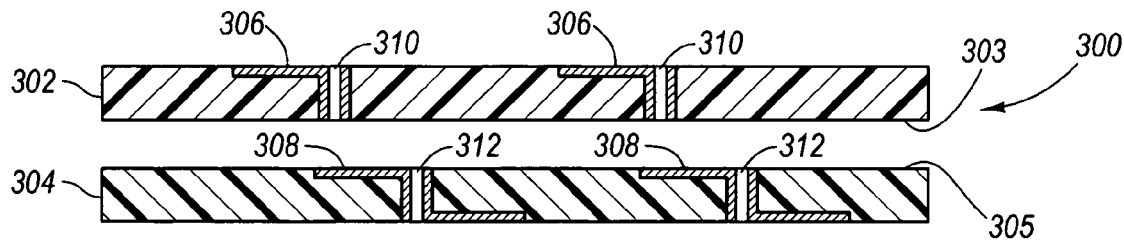

The bonding process can further entail a chemical mechanical planarization (CMP) process, as represented by FIG. 3B. The CMP process can be used to smooth surfaces 303, 305 to be bonded. Specifics of this process were also discussed above with reference to FIG. 2. While useful in some exemplary embodiments, the CMP process step is optional.

Figure 3C:
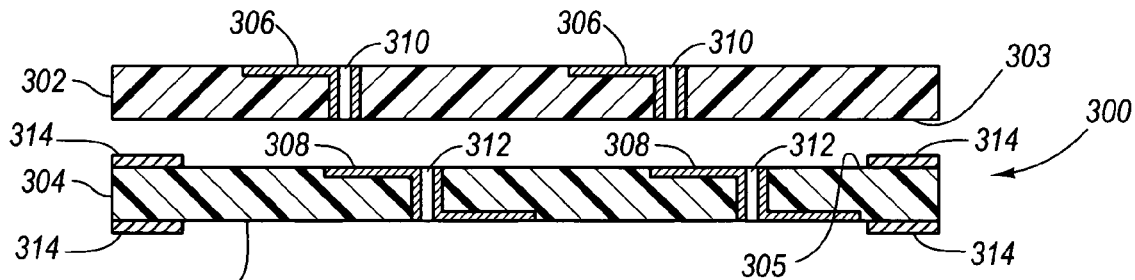

The bonding process can also include applying an amorphous thin film 314 to one or more of surfaces 303, 305 of wafers 302, 304, respectively, as illustrated in FIG. 3C. In anticipation of bonding multiple wafers, thin film 314 can also be applied to a lower surface 307 of wafer 304. As discussed above with reference to FIG. 2, this amorphous thin film 314 can be, by way of example and not limitation, silicon, silicon suboxide, or any other film with the desired barrier properties that is compatible with the wafer substrate. Specific properties for the barrier film were also discussed above with reference to FIG. 2.

As shown in FIG. 3C, this thin film 314 is applied to the edges of wafer 302 and 304. One skilled in the art will understand, that in other embodiments, thin film 314 can be applied to substantially all of surface 305 of wafer 304 or substantially all of surface 303 of wafer 302. Similarly, thin film 314 can be applied to substantially all of surface 307 of wafer 304 when the same is to bond with another wafer, layer, or substrate.

Figure 3D:
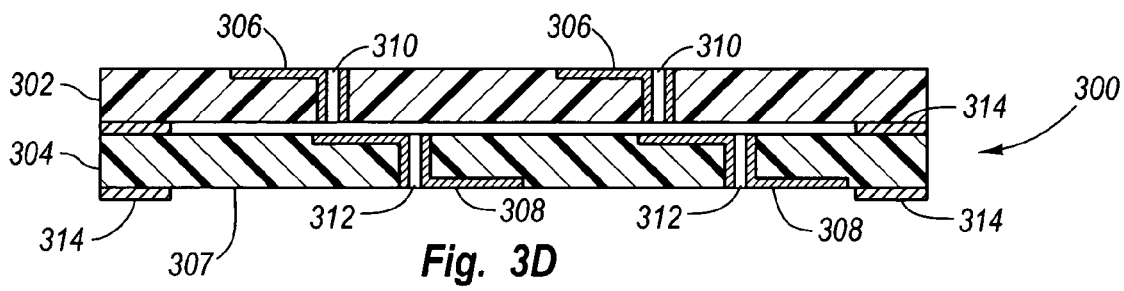

FIG. 3D represents another step of the bonding process. This step can include placing wafers 302 and 304 in contact with each other and applying a voltage across them. Mechanical pressure can be applied to hold both surfaces 303 and 305 in contact with each other at the locations where thin film 314 is deposited. Once the surfaces 303 and 305 are contacting, a voltage of approximately hundreds of volts is applied, sufficient to raise the temperature of contact surfaces 303, 305 to about 250 degrees Celsius. The primary function of the temperature is to reduce the migration time of the ions to the boundary of the barrier layer, i.e., thin film 314. The electric field performs the function of drawing the wafers together and also activating the bonding process. This activation process is a result of bond breakage and reformation where the activation energy comes from a combination of electric field and temperature. Consequently, the electric field causes permanent bonding of surface 303 to surface 305 at the location where thin film 314 is deposited.

Figure 3E:
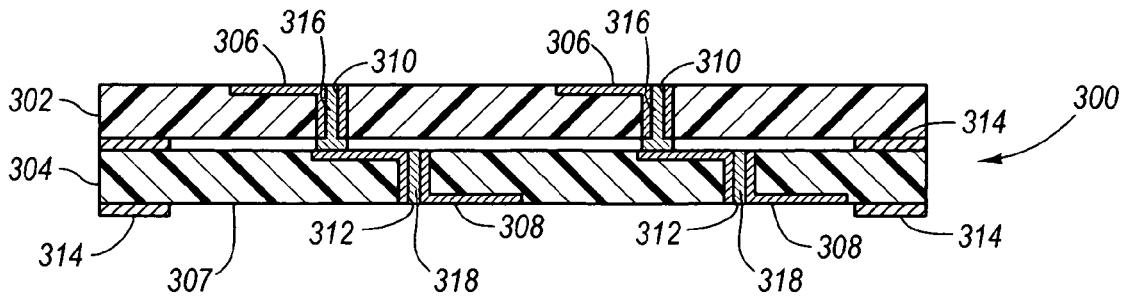

FIG. 3E illustrates a final step of the bonding process that includes filling the holes 310, 312 with an electrically conductive filler material 316, 318, respectively. The filler material makes the actual electrical connections between wafers 302, 304. Filler material 316, 318 can be, by way of example and not limitation, any of various types of electrical solder. There are various techniques that can be used to perform the step of filling the holes 310, 312 to make the electrical connections between layers. It can also be advantageous to be able to make and/or break electrical connections within a layer as opposed to between layers as part of the anodic bonding process. Some of these techniques for making electrical connections between layers or between circuits/traces on a single layer will be discussed below with reference to FIGS. 4A-4J.

The waffle technique described above with reference to FIG. 2D and FIGS. 3A-3E has several advantages. Bubble formation is not a problem, since a relatively small area is actually being bonded, i.e., bonding of surfaces 303 and 305 where thin film 314 is deposited. Less mechanical pressure is needed because the applied pressure is distributed over a much smaller surface area defined by thin film 314. The electric field is concentrated along the bond lines defined by thin film 314 and not through the circuitry. Film stress is much less a concern since the amount of film area is greatly reduced compared with bonding the entire wafer surface. Any planarization step (CMP process) is significantly faster because only those portions of surfaces having thin film 315 need receive planarization. Because the speed of such processes is usually linearly related to the amount of material to be removed, which is proportional to the area to be polished, the process is faster. Finally, the potential of an electrical short being formed is reduced because, at least in some embodiments, the wafer to wafer connections 316, 318, are made after each wafer is bonded. In other embodiments, as described below with reference to FIGS. 4A-4F, the wafer to wafer connections can be made simultaneously when the anodic bonding temperature is reached. The process described with respect to FIGS. 3A-3E can be repeated as often as necessary to create the desired structure of multiple interconnected wafers, layers, or substrates.

If there is a gap between the layers, then in order to keep the traces and components from shorting, and also to keep from interfering with the contact of the bonding surfaces, then the usual via or hole forming techniques will not work. For the sake of simplicity we will illustrate via processes only for the case of deposited material since the processes remain essentially unchanged for the case of etched wafers and separate interposer layers as described above.

Figure 4A:
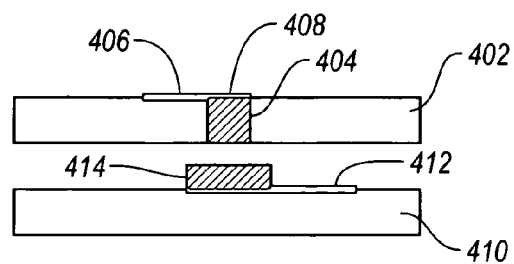
FIGS. 4A and 4B illustrate one method of forming vias between layers according to an alternate aspect of the present invention.
Figure 4B:
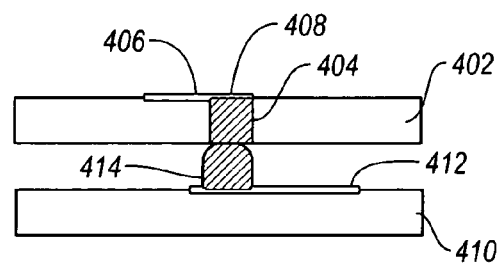

FIGS. 4A and 4B illustrate one embodiment of a technique that can be used to fill the vias and make electrical connections between the various circuit layers in the substrate. FIG. 4A illustrates a first layer 402 containing a hole or via 404, a trace or other electrical contact 406, and a filler material 408 within via 404. As part of the technique, a second layer 410 is located immediately below and proximate first layer 402. This second layer 410 includes an electrical trace or other electrical contact 412, and a pad 414. Pad 414 can comprise various types of solder or other conductive substance with a low melting point.

With this second layer 410 in position relative to filler material 408 and via 404, heat is applied to the via/pad area as part of the anodic bonding process or as a separate step after the anodic bonding process. As shown in FIG. 4B, when heat is applied to the via/pad area, surface tension causes pad 414 to bead up and fuse with filler material 408 in via 404. The surface tension can be controlled by textural and compositional modifications to the surface of pad 414, and by the specific material composition of pad 414. For example, the surface of pad 414 may have a graded series of roughness that will produce more or less surface tension on the filler material, thus determining where and how much it flows. Pad 414 can be produced by plating, Physical Vapor Deposition (PVD), Chemical Vapor Deposition (CVD), or by other processes known to those of skill in the art. In addition to textural changes, the surface of the pad may be modified by alloying, metaliding, or depositing (PVD, plating, etc) other substances on it. One advantage of modifying pad 414 is that spatial modifications to the surface can guide the position, and to some degree the height and shape, of the reflowed alloy. The via filler material 408 may be the same or different from the pad alloy.

While in one embodiment, the process resulting in reflow of pad 414 can happen during the temperature rise that accompanies the anodic bonding step, there is nothing that prevents one from using a temperature that results in reflow of filler material 408 and/or pad 414 that is higher than the bonding temperature and performing the reflowing process after bonding. In particular, in the case of clear substrates like glass and silicon (in the IR beyond 1200 nm) pads 414 can be selectively heated with a laser so long as there is an unobstructed path for the light beam to pad 414. One advantage of this is that select-on-test and other post assembly circuit modifications or tuning can be done this way.

Figure 4C:
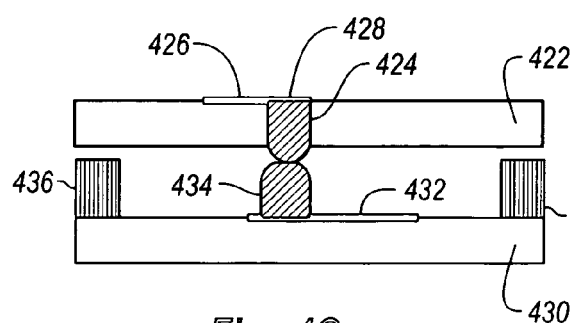
FIGS. 4C and 4D illustrate an alternate method of forming vias between layers.
Figure 4D:
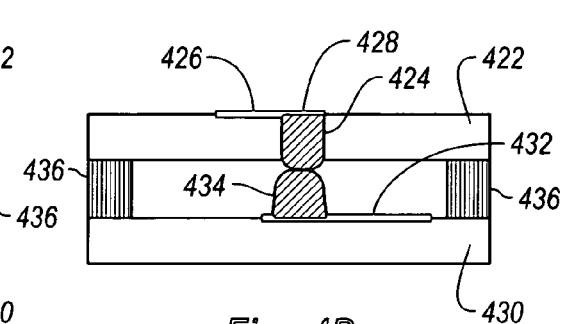

FIGS. 4C and 4D illustrate an alternate embodiment of a technique that can be used to fill the vias and make electrical connections between the various circuit layers in the substrate. FIG. 4C illustrates a first layer 422 containing a hole or via 424, a trace or other electrical contact 426, and a filler material 428 within via 424. Prior to performing the heating step in a similar manner to that described with respect to FIGS. 4A and 4B, which can be performed as part of the anodic bonding process, or as a separate step after the anodic bonding process, a second layer 430 is located immediately below and proximate to the first layer 422. Second layer 430 can include an electrical trace or other electrical contact 432, and a pad 434 in contact with filler material 428. Pad 434 can include various types of solder or other conductive substance with a low melting point. Additionally, there can be one or more silicon bond lines 436 separating first and second layers 422, 430. In some embodiments, the silicon bond lines 436 are synonymous with the saw street illustrated in FIG. 2D.

In this embodiment, the pad metal and via filler material metal mix at the point where they touch to form a low melting temperature alloy. In some embodiments, the melting temperature of the alloy is lower than the bonding temperature used to join layers 422, 430. The low melting temperature alloy allows first layer 422 to settle down until silicon bond lines 436 are in place, i.e., contact first layer 422.

As with the embodiment shown in FIGS. 4A and 4B, in one embodiment the process resulting in the flow of filler material 428 and/or pad 434 can happen during the temperature rise that accompanies the anodic bonding step. However, there is nothing that prevents one from using a temperature that results in reflow of filler material 428 and/or pad 434 that is higher than the bonding temperature and performing the reflowing process after bonding. In particular, in the case of clear substrates like glass and silicon (in the IR beyond 1200 nm) pads 434 can be selectively heated with a laser so long as there is an unobstructed path for the light beam to the pad 434. One advantage of this is that select-on-test and other post assembly circuit modifications or tuning can be done this way.

Figure 4E:
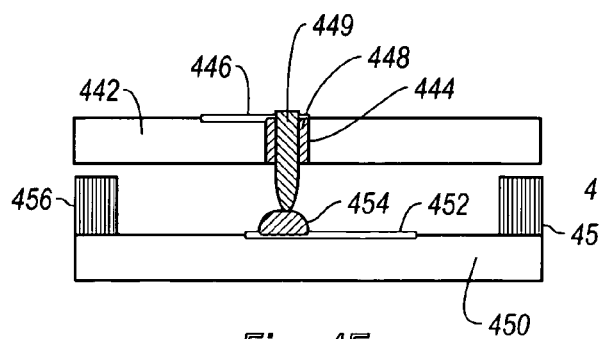
FIGS. 4E and 4F illustrate another alternate method of forming vias between layers.
Figure 4F:
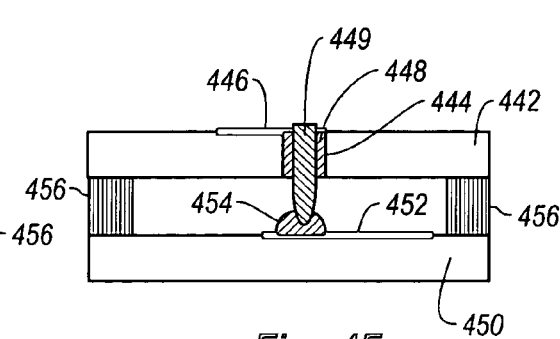

Another alternate embodiment of a method for connecting the electrical traces between layers is illustrated in FIGS. 4E and 4F. FIG. 4E illustrates a first layer 442 containing a hole or via 444, a trace or other electrical contact 446, and a via paste or metal filler material 448 contacting the inside surface of via 444. Additionally, in this embodiment, an electrically conductive pin 449 is inserted through via 444. Prior to performing the heating step in a similar manner to that described with respect to FIGS. 4A-4D, which can be performed as part of the anodic bonding process, or as a separate step after the anodic bonding process, a second layer 450 is located immediately below and proximate to the first layer 442. Second layer 450 can include an electrical trace or other electrical contact 452, and a pad 454 in contact with filler material 448. Pad 454 can include various types of solder or other conductive substance with a low melting point. Additionally, there can be one or more silicon bond lines 456 separating first and second layers 442, 450.

With this second layer 450 in position relative to filler material 448 and via 444, heat is applied to the via/pad area as part of the anodic bonding process or as a separate step after the anodic bonding process. As shown in FIG. 4E, when heat is applied to the via/pad area, pad 454 reflows allowing pin 449 to settle into the flowing pad 454 and first layer 442 to settle down until silicon bond lines 456 are in place, i.e., contacting first layer 442. In some embodiments, pad 454 can be a preform washer that can receive a portion of pin 449 prior to reflow of pad 454. In such a case, pin 449 can settle into a hole within pad 454 and pad 454 reflows around pin 449 at a given temperature.

In this embodiment, pin 449 can be inserted until flush with the top outer surface of layer 442. The reflow temperature, i.e., the temperature that causes flow of pad 454 and/or filler material 448, may be higher or lower than the bonding temperature, but in general will be lower. If the height of pin 449 is critical, then a two step process can be used where pin 449 is first reflowed, brazed, or otherwise bonded into via 444 at a temperature higher than the wafer bonding temperature so that its position with respect to first layer 442 remains fixed during the LTWB process.

The ability to form circuits by making connections as shown above with reference to FIGS. 4A-4F, can be quite useful. The is especially the case In connection post assembly test and modification, such as select-on-test components and other tuning operations that need to happen after the device is assembled. However, equally useful is the ability to make or break connections within a layer as opposed to between layers. One method of breaking such connections is discussed below with reference to FIGS. 4G and 4H. A method of making such connections is discussed below with reference to FIGS. 4I and 4J.

Figure 4G:
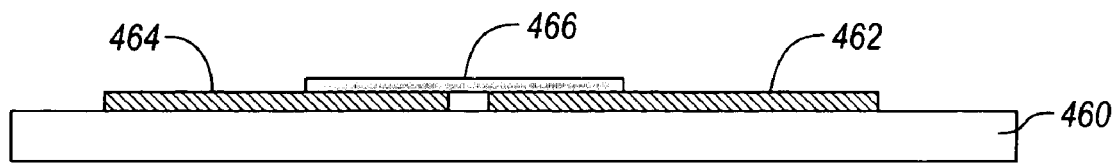
FIGS. 4G and 4H illustrate one method of breaking electrical connections between traces on a layer after the layers have been bonded.
Figure 4H:
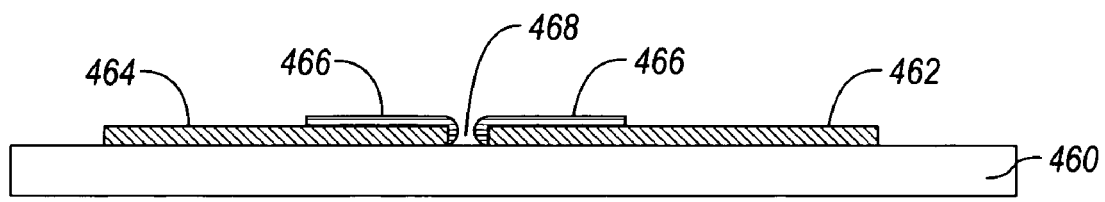

FIG. 4G illustrates one layer 460 having a first and second trace or other electrical component 462, 464 mounted thereon. A fusible link 466 is disposed between traces 462, 464. When fusible link 466 is heated, by laser for instance, to a temperature hotter than the LTWB temperature, link 466 will melt and separate, thus forming a gap 468, shown in FIG. 4H. The surface tension of traces 462, 464 for link 466 can be designed to be much higher than the surface tension between layer 460 and link 466. Generally the fusible link material can be soldered to the traces with a lower temperature solder than the melting point of the link material. The fusible link material 466 should melt at a higher temperature than required for the wafer bonding so that the circuit tuning can be done after the assembly of the layers. In the event that there is no clear path for laser heating the link, the link can be electrically heated directly or indirectly. An example of indirect heating would be to heat a block of material directly below the link and, by thermal conduction, melt the link. If the surface of the block material has a low affinity for the link material, then the link will separate forming an open circuit; if the affinity is high, then link material on two sides will flow together to form a closed circuit.

Figure 4I:
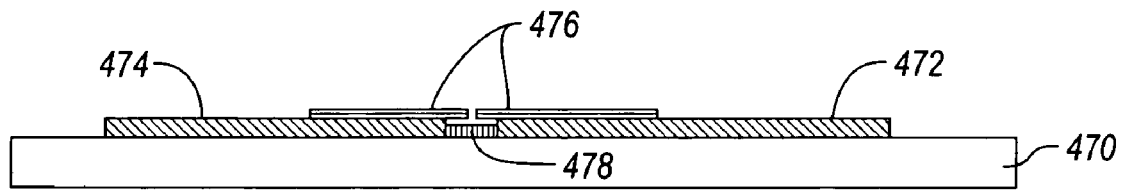
FIGS. 4I and 4J illustrate one method of making electrical connections between traces on a layer during the bonding process.
Figure 4J:
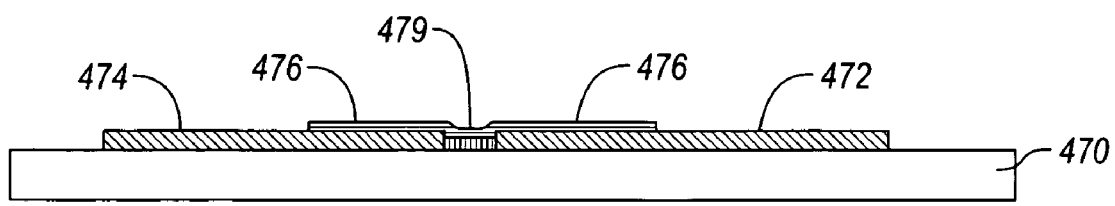

One method of making electrical connections between traces during the bonding process is illustrated in FIGS. 4I and 4J. FIG. 4I illustrates a layer 470 having a first and second trace or other electrical component 472, 474 mounted thereon. Fusible link material 476 is disposed on top of traces 472, 474. Additionally, a high affinity material is 478 is disposed between, but not connected to, traces 472, 474.

The high affinity material 474 has a high surface tension for fusible link material 476. One example of a material that can be suitable for fusible link material 476 is a tin/silver/copper alloy. In one embodiment, this alloy can be Sn96Ag3Cu1, where the number refer to the weight percent of each element in the alloy, which melts around 210° C. In this embodiment, the high affinity material can be silver coated copper tinned with a thin layer of Sn96Ag4. So long as the trace metalization is something that has a lower affinity for fusible material 476 than high affinity material 478 between traces 472, 474, upon melting fusible material 476 will flow and spread over high affinity material 478, thus making a connection where there was previously a gap. It should be noted that to get this kink of system to work correctly requires some skill in formulating the alloys and surface textures.

Figure 5A:
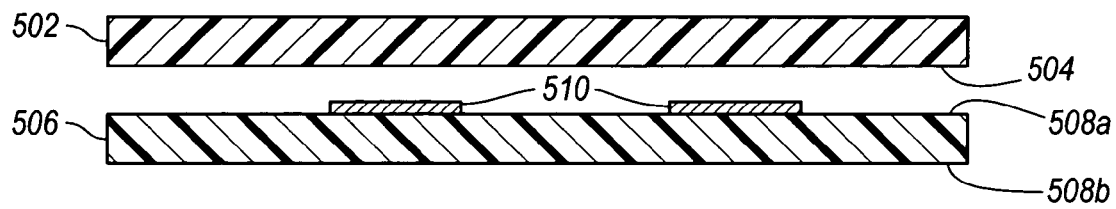
FIGS. 5A-5F illustrate the steps in an alternative exemplary process of anodic bonding according to an alternate aspect of the present invention.

FIGS. 5A-5F illustrate another exemplary embodiment of an anodic bonding process where a bond is formed over an entire surface of a wafer, rather than at discrete locations, as described with respect to FIGS. 3A-3E. With reference to FIG. 5A, illustrated is a first wafer 502 having an inside surface 504, and a second wafer 506 having an inside surface 508a and an outside surface 508b. Applied to inside surface 508a are various circuits/components 510. Application of these various circuits/components 510 can occur using a metal sputtering and patterning techniques or steps known to those skilled in the art. In alternative exemplary embodiments of the present invention, electrical components and/or circuits can also be applied to surface 504 of wafer 502.

Figure 5B:
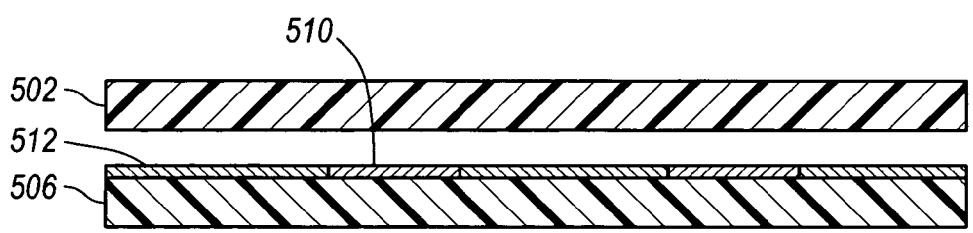
Figure 5C:
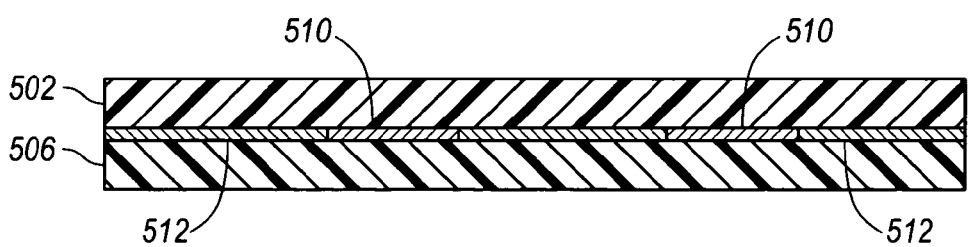

With reference to FIG. 5B, applied around circuits 510 is a thin film 512. Film 512 can be any of the thin films previously discussed with reference to the other embodiments of the present invention. This thin film 512 aids with bonding wafer 502 to wafer 506. Once mechanical pressure is applied to ensure good contact between surfaces 504, 508a and thin film 512, as illustrated in FIG. 5C, an electrical voltage of approximately hundreds of volts is then applied across wafers 502, 506 to effectuate the bonding process, as previously described with reference to FIGS. 2 and 3.

Figure 5D:
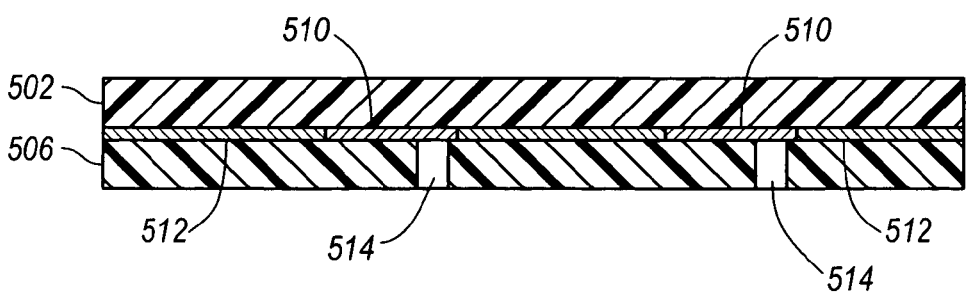
Figure 5E:
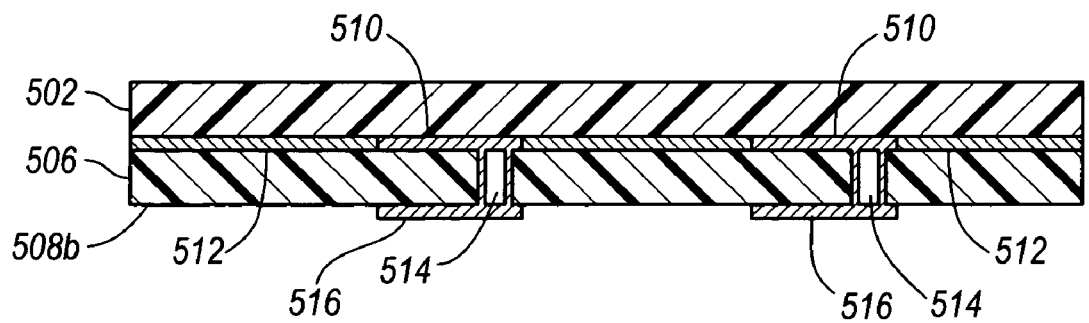

Once wafers 502, 506 have been bonded, holes 514 can be drilled into the wafers to make the electrical connections between the wafers, as illustrated in FIG. 5D. These holes 514 can be made using laser drilling, or any other form of etching known to those of skill in the art. Additional circuits/components 516 can be applied to a surface 508b of wafer 506 using a similar technique to that described with respect to FIG. 5A.

Figure 5F:
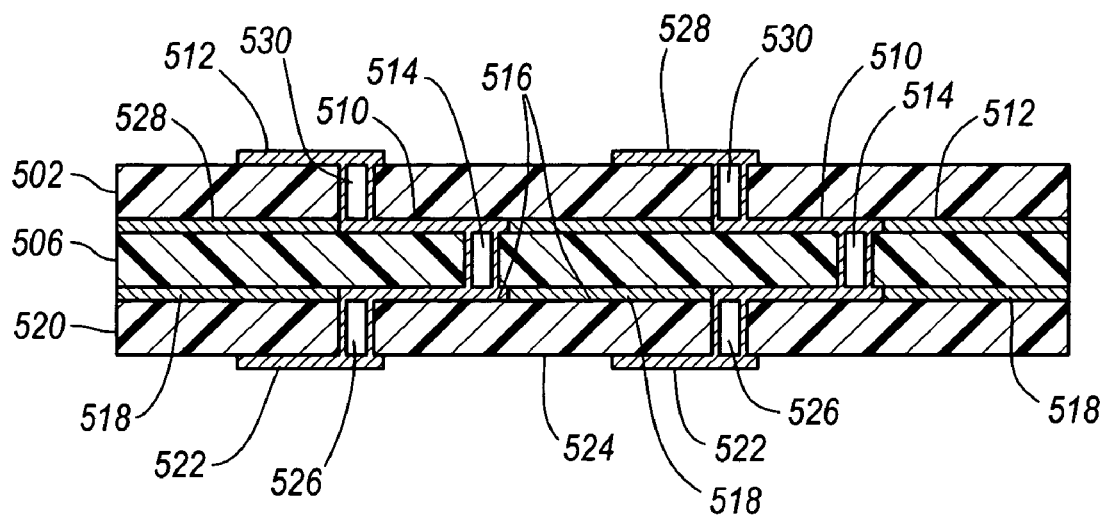
Figure 2B:
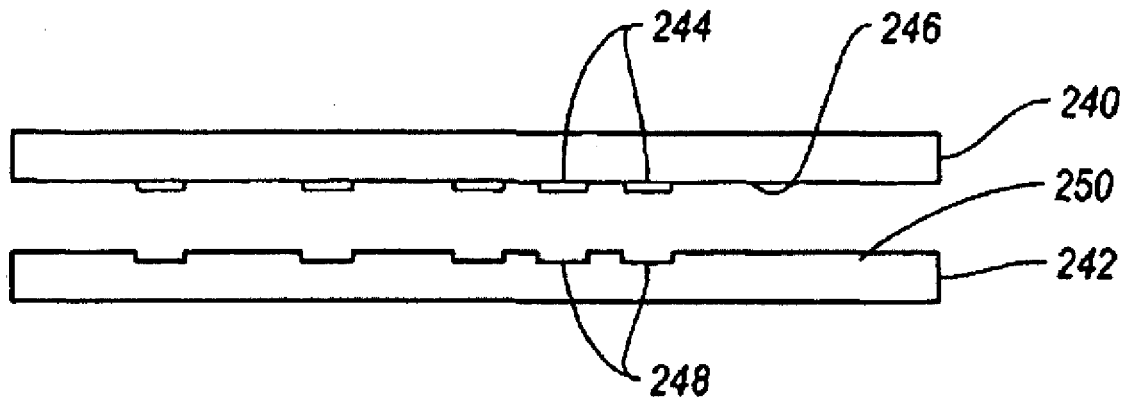
Figure 5F:
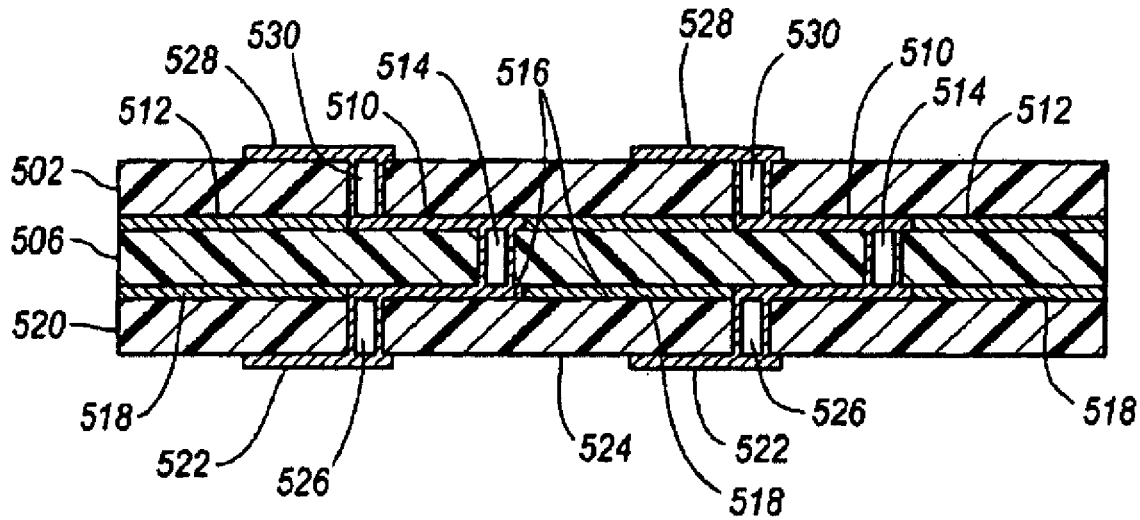

The process described with respect to FIGS. 5A-5E can be repeated as often as necessary to create the desired structure of multiple interconnected wafers, layers, or substrates. An exemplary embodiment of a stack formed using the process of FIGS. 5A-5E is illustrated in FIG. 5F.

As shown, an additional wafer 520 is bonded to wafer 506 using thin film 518. As previously described, additional circuitry 522 can be applied to a surface 524 of wafer 520. Holes 526 can then be drilled in wafer 520 to make electrical connections to circuitry 522. Additional circuitry 528 can also be added to wafer 502. Holes 530 can then be drilled in wafer 502 to make electrical connections to circuitry 510 on wafer 506. In this exemplary embodiment, only three wafers 502, 506, 520 have been bonded. However, those skilled in the art will realize that the exemplary process works with two or more wafers, layers, or substrates to form multilayer, multiple wafer, or multiple substrate stack. Any electrical short problem is avoided in this case by forming holes 514, 526, 530 after the bonding process. One can cycle through the intermediate steps as many times as necessary to build up the desired number of wafers, layers, or substrates before progressing to the last step where the final connections to the top and bottom surfaces are made.

Multiple interconnections between wafers, layers, or substrates (not shown) can be formed after performing the final bonding step. After forming these connections, there will generally be an electrical connection through and/or around the stack, so that additional wafers can no longer be bonded to the stack. It should be mentioned that through thoughtful design it is possible to include a testing ability for intermediate steps in the event that there are multiple wafers, layers, or substrates. Although in general there is no way to fix problems after the wafers, layers, or substrates are bonded, the yet-to-be-bonded wafers, layers, or substrates can be salvaged once a problem is found in the bonded stack.

The exemplary improved anodic bonding process of the present invention can be performed at temperatures of about 250° C., 275° C., 300° C., or some other temperatures than the identified temperatures to avoid damaging embedded components or solder connections on the semiconductor wafers. More generally, the anodic bonding process can be performed at temperatures greater than 250° C.

The voltage across the substrates, wafers, or layers can be approximately 900 volts, 700 voltages, and more generally about the higher hundreds of volts, but other voltages can be used based upon the materials being used and the temperature desired.

The present invention can be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of forming an electrical connection, the method comprising the steps of:
   forming a via in a first circuit layer of a substrate;
   placing a first electrically conductive substance in said via so that the first electrically conductive substance is carried by the first circuit layer, the first electrically conductive substance being electrically connected with an element of the first circuit layer;
   placing a second electrically conductive substance on a second circuit layer of the substrate so that the second electrical substance is electrically connected with an element of the second circuit layer, the second electrically conductive substance being positioned proximate said first electrically conductive substance; and
   applying heat such that a physical relation between said first and second electrically conductive substances is altered, the first and second circuit layers being electrically connected to each other after the heat application, wherein said first electrically conductive substance comprises a pin fixed within said via and said second electrically conductive substance comprises a preformed washer having a hole, wherein said hole receives said pin and said washer melts to electrically connect the first and second circuit layers during said heating step.

2. The method of claim 1, wherein said heating step melts said second electrically conductive substance such that a surface tension of said melted substance allows said second electrically conductive substance to bead up and contact said first electrically conductive substance.

3. The method of claim 1, wherein said heating step comprises using a laser to generate heat.

4. A method of forming an electrical connection, the method comprising the steps of:
   forming a via in a first circuit layer of a substrate;
   placing a first electrically conductive substance in said via so that the first electrically conductive substance is carried by the first circuit layer, the first electrically conductive substance being electrically connected with an element of the first circuit layer;
   placing a second electrically conductive substance on a second circuit layer of the substrate so that the second electrical substance is electrically connected with an element of the second circuit layer, the second electrically conductive substance being positioned proximate said first electrically conductive substance;
   applying heat such that a physical relation between said first and second electrically conductive substances is altered, the first and second circuit layers being electrically connected to each other after the heat application; and
   a step for applying an amorphous thin film to one of a first contact side of the first layer and a second contact side of the interposer structure and applying a voltage to said layers to anodically bond said layers together at a temperature below 300 degrees Celsius, wherein said anodic bonding heats said area.

5. The method of claim 4, wherein said amorphous thin film comprises one of silicon and silicon suboxide.

6. The method of claim 4, wherein said voltage is approximately 700 volts.

7. The method of claim 1, wherein said first and second electrically conductive substances are in contact with each other prior to said heating step.

8. The method of claim 1, wherein said heating step comprises using an electrically heated block proximate to the area to be heated.

9. In a substrate comprising at least a first and a second layer, each of the first and second layers having a periphery and having at least one electrical trace on a surface of the layers, the first and second layers capable of being connected at a plurality of points around the periphery such that the surfaces are not in physical contact with each other, a method of forming an electrical connection between the first layer and the second layer, the method comprising the steps of:
  forming a hole in the first layer;
  placing a first electrically conductive substance in said hole;
  placing a second electrically conductive substance on the second layer adjacent said hole;
  heating an area around said hole and said second electrically conductive substance until said first and second electrically conductive substances at least partially melt to form the electrical connection; and
  applying a voltage to said layers to anodically bond said layers together at the plurality of points, said voltage generating sufficient heat to accomplish said heating step.

10. The method of claim 9, wherein said heating step melts said second electrically conductive substance such that a surface tension of said melted substance allows said substance to bead up and contact said first electrically conductive substance.

11. The method of claim 9, wherein said heating step comprises using a laser to heat said area.

12. The method of claim 9, wherein said heating step comprises using an electrically heated block proximate to the area to be heated.

13. The method of claim 9, wherein said heating step comprises using Joule heating of a fusible link itself to heat said area.

14. The method of claim 9, wherein said voltage is approximately 700 volts.

15. The method of claim 9, wherein said first and second electrically conductive substances are in contact with each other prior to said heating step.

16. The method of claim 15, wherein said first electrically conductive substance comprises a pin fixed within said hole.

17. The method of claim 16, wherein said second electrically conductive substance comprises a preformed washer having a second hole, wherein said hole receives said pin and said washer melts to form the electrical connection during said heating step.

18. The method of claim 1, wherein the first and second electrically conductive substances are not in contact with each other prior to the application of heat.

19. A method of forming an electrical connection, the method comprising the steps of:
  forming a via in a first circuit layer of a substrate;
  placing a first electrically conductive substance in said via so that the first electrically conductive substance is carried by the first circuit layer, the first electrically conductive substance being electrically connected with an element of the first circuit layer;
  placing a second electrically conductive substance on a second circuit layer of the substrate so that the second electrical substance is electrically connected with an element of the second circuit layer, the second electrically conductive substance being positioned proximate said first electrically conductive substance; and
  applying heat such that a physical relation between said first and second electrically conductive substances is altered, the first and second circuit layers being electrically connected to each other after the heat application, wherein:
  a silicon bond line of one of the circuit layers is displaced from the other circuit layer prior to the application of heat; and
  the silicon bond line is in contact with both the first and second circuit layers after the application of heat.

20. The method of claim 1, wherein the electrical connection between the first and second circuit layers is located within an opening defined by an interposer layer that is positioned between the first and second circuit layers.

21. The method of claim 20, further comprising:
  applying an amorphous thin film to one of a first contact side of the first circuit layer and a second contact side of the interposer structure; and
  applying a voltage to said first circuit layer and said interposer structure to anodically bond said first circuit layer and said interposer structure together.

22. The method of claim 1, wherein a desired flow characteristic of the second electrically conductive substance is achieved by one of:
  texturing a surface of the second electrically conductive substance; or
  selecting a material composition of the second electrically conductive substance that corresponds with the desired flow characteristic.

23. The method of claim 1, wherein said first electrically conductive substance comprises:
  filler material disposed within said via; and
  a pin fixed to said filler material, said pin and said filler material being carried by said first circuit layer.

24. The method of claim 1, further comprising modifying a surface of the second electrically conductive substance by performing one of the following:
  alloying a portion of the second electrically conductive substance;
  metaliding a portion of the second electrically conductive substance; or
  depositing a substance on the second electrically conductive substance.

* * * * *

UNITED STATES PATENT AND TRADEMARK OFFICE
CERTIFICATE OF CORRECTION

PATENT NO.       : 7,361,593 B2                                             Page 1 of 3
APPLICATION NO.  : 11/027745
DATED            : April 22, 2008
INVENTOR(S)      : Freeman et al.

It is certified that error appears in the above-identified patent and that said Letters Patent is hereby corrected as shown below:

Title Page
Item 56, References Cited, U.S. Patent Documents, change "5,318,652 A  6/1994  Horning et al." to --5,318,652 A  6/1994  Hocker et al.--

Drawings
Sheet 2, replace FIG. 2A with the figure depicted below, wherein trace 213 is added

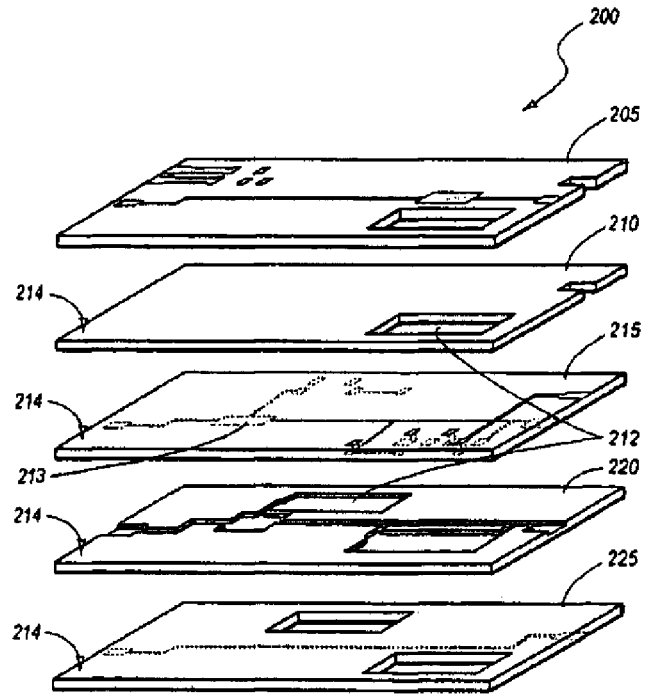

Fig. 2A

Signed and Sealed this

Twenty-eighth Day of September, 2010

David J. Kappos
*Director of the United States Patent and Trademark Office*

Sheet 3, replace FIG. 2B with the figure depicted below, wherein surface 216 is relabeled 246 and excavations 246 are relabeled 248

Sheet 8, replace FIG. 5F with the figure depicted below, wherein the label for circuitry 512 is changed to 528 and the label for thin film 528 is changed to 512

Column 1
Line 49, change "one general system" to --one general system, designated generally at 100,--

Column 7
Line 36, change "as cutouts 212." to --as cutouts 212 (FIG. 2A).--
Line 41, change "and 225." to --and 225 (FIG. 2A).--
Line 42, change "of wafer 215" to --of wafer 215 (FIG. 2A).--

Column 12
Line 13, change "material" to --material 466--
Line 14, change "the link material" to --the link material 466--
Line 18, change "the link, the link can" to --the link 466, the link 466 can--
Line 21, change "below the link" to --below the link 466--
Line 21, change "melt the link" to --melt the link 466--
Line 23, change "the link" to --the link 466--
Line 34, change "The high affinity material 474" to --The high affinity material 478--
Line 40, change "the high affinity material" to --the high affinity material 478--
Line 46, change "a connection" to --a connection 479--
Line 47, change "this kink" to --this kind--

Column 13
Line 14, change "wafer 506" to --wafer 506 (FIG. 5E).--